United States Patent
Jo (10) Patent No.: US 9,370,116 B2
(45) Date of Patent: Jun. 14, 2016

(54) DISPLAY DEVICE

(71) Applicant: Samsung Display Co., Ltd., Yongin, Gyeonggi-do (KR)

(72) Inventor: Jae-Uk Jo, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 152 days.

(21) Appl. No.: 13/895,604

(22) Filed: May 16, 2013

(65) Prior Publication Data

US 2014/0078705 A1    Mar. 20, 2014

(30) Foreign Application Priority Data

Sep. 17, 2012   (KR) .................. 10-2012-0102998

(51) Int. Cl.
| H05K 7/10 | (2006.01) |
| H05K 7/02 | (2006.01) |
| G02F 1/1345 | (2006.01) |
| H01L 27/32 | (2006.01) |

(52) U.S. Cl.
CPC .............. *H05K 7/02* (2013.01); *G02F 1/13452* (2013.01); *H01L 27/3276* (2013.01)

(58) Field of Classification Search
CPC ... G02F 1/13452; H01L 27/3276; H05K 7/02
USPC .......... 361/767, 771, 777, 779, 760; 174/254, 174/259, 260
See application file for complete search history.

(56) References Cited

U.S. PATENT DOCUMENTS

| 5,668,700 | A | * | 9/1997 | Tagusa et al. ................ 361/779 |
| 6,507,384 | B1 | * | 1/2003 | Endo et al. .................... 349/149 |
| 7,751,016 | B2 | * | 7/2010 | Abe et al. ...................... 349/150 |
| 8,039,753 | B2 | * | 10/2011 | Jang et al. ..................... 174/254 |
| 2002/0149921 | A1 | * | 10/2002 | Terasaka ....................... 361/803 |
| 2005/0224561 | A1 | * | 10/2005 | Kurasawa et al. ....... 228/180.22 |
| 2008/0239680 | A1 | * | 10/2008 | Yasuda ......................... 361/748 |
| 2009/0250250 | A1 | | 10/2009 | Ishii |
| 2014/0069500 | A1 | * | 3/2014 | Reed ............................ 136/259 |

FOREIGN PATENT DOCUMENTS

| KR | 10-2004-0053949 | 6/2004 |
| KR | 10-2006-0056127 | 5/2006 |
| KR | 10-2009-0105865 | 10/2009 |

* cited by examiner

*Primary Examiner* — Yuriy Semenenko
(74) *Attorney, Agent, or Firm* — Knobbe Martens Olson & Bear LLP (57) ABSTRACT

A display device includes: a display substrate in which a display for displaying an image is formed; an encapsulation substrate, which is assembled on the display substrate and has a first surface facing the display substrate and a second surface opposite to the first surface; and a circuit substrate for transferring an electrical signal to the display, where a plurality of pads, which are electrically connected to the display and connected to the circuit substrate, are formed on the first surface of the encapsulation substrate, and at least one connector is formed on surfaces of the display and the encapsulation substrate which face each other, the connector configured to provide a connection path between the display and the circuit board by being adhesively pressed in a vertical direction.

14 Claims, 6 Drawing Sheets

DISPLAY DEVICE

CROSS-REFERENCE TO RELATED APPLICATIONS

This application claims the benefit of Korean Patent Application No. 10-2012-0102998, filed on Sep. 17, 2012, in the Korean Intellectual Property Office, the disclosure of which is incorporated herein in its entirety by reference.

BACKGROUND

1. Field

The present disclosure relates to a display device in which a circuit substrate is easily connected.

2. Description of the Related Technology

In general, flat display devices are classified into a light-emitting type and a light-receiving type. Light-emitting display devices include organic light-emitting display devices, plasma display panels (PDPs), vacuum fluorescent display panels (VFDs), light-emitting diode (LED) panels, and so forth, and light-receiving display devices include liquid crystal display (LCD) panels, and so forth.

Among flat display devices, organic light-emitting display devices have wide view angles, excellent contrast, and quick response time. Thus, organic light-emitting display devices are highlighted because they can be applied to display devices for mobile devices, such as digital cameras, video cameras, camcorders, portable information terminals, smart phones, super-slim laptop computers, tablet personal computers, and flexible display devices, and electronic/electrical products, such as super-thin TVs.

In general, a display device, such as an organic light-emitting display device, includes a display for displaying an image and a plurality of pads electrically connected to the display, which are formed on a substrate, where the plurality of pads are bonded using a flexible printed circuit board (FPCB). After the plurality of pads are bonded to the FPCB, the FPCB is bent toward and attached to the rear surface of the substrate to reduce an area of the display device and prevent interference with the FPCB. In this case, since the bent FPCB applies a continuous stress to a pad bonding part, a product may be damaged, and the bonding reliability may be lowered.

SUMMARY OF CERTAIN INVENTIVE ASPECTS

The present disclosure provides a display device in which bonding reliability is improved by performing adhesive pressure bonding of a circuit board having flexibility in an encapsulation substrate facing a display substrate.

According to an aspect of the present invention, there is provided a display device including: a display substrate in which a display for displaying an image is formed; an encapsulation substrate, which is assembled on the display substrate and has a first surface facing the display substrate and a second surface opposite to the first surface; and a circuit substrate for transferring an electrical signal to the display, wherein a plurality of pads, which are electrically connected to the display and connected to the circuit substrate, are formed on the first surface of the encapsulation substrate, and at least one connector is formed on surfaces of the display unit and the encapsulation substrate which face each other, the at least one connector configured to provide a connection path between the display unit and the circuit board by being adhesively pressed in a vertical direction.

An area of at least one side of the encapsulation substrate may extend outside the display substrate, and the plurality of pads may be formed on an exposed area of the encapsulation substrate and connected to at least one wiring line extending from the at least one connector towards the first surface of the encapsulation substrate.

The encapsulation substrate may be formed larger than the display substrate by at least the exposed area.

The connector may include: a plurality of patterns formed on facing surfaces of the display substrate and the encapsulation substrate; and a conductor for electrically connecting the plurality of patterns to each other.

The plurality of patterns may include: a plurality of first patterns, which are formed on one edge of the display substrate and extend from the display; and a plurality of second patterns, which are formed on the encapsulation substrate and are connected to the plurality of pads via wiring lines.

The conductor may be a conductive paste, which electrically connects the plurality of first patterns and the plurality of second patterns and is coated over a side wall of the display substrate at which the plurality of first patterns and the plurality of second patterns contact each other and the exposed area of the encapsulation substrate.

The plurality of first patterns and the plurality of second patterns may have the same pattern.

The conductor may include a conductive film interposed between the plurality of first patterns and the plurality of second patterns.

The conductive film may include: conductive particles for electrically connecting the plurality of first patterns and the plurality of second patterns; and an insulating resin surrounding the conductive particles.

The circuit substrate may have flexibility to have a plurality of terminals electrically connected to the plurality of pads.

The circuit substrate may be arranged to extend from the first surface of the encapsulation substrate to the rear surface of the display substrate.

A filling member for filling up a separation space may be formed on the first surface of the encapsulation substrate facing the circuit substrate.

The connector for connecting the display driver IC may include a first pattern formed on the display substrate and extending from the display and a second pattern formed on the encapsulation substrate and formed at a location corresponding to the first pattern in a vertical direction. The connector for connecting the circuit substrate may include a third pattern formed on the display substrate and extending from the display and a fourth pattern formed on the encapsulation substrate and formed at a location corresponding to the third pattern in the vertical direction. A conductor may electrically connect between the first and second patterns and between the third and fourth patterns.

The at least one wiring line may include a first wiring line and a second wiring line connected to the plurality of pads, the first wiring line extending from the second pattern may be formed on the exposed area of the encapsulation substrate, the display driver IC may be adhesively pressure-bonded on the first wiring line, the second wiring line extending from the fourth pattern may be formed on the exposed area of the encapsulation substrate, and the circuit substrate may be adhesively pressure-bonded on the second wiring line.

The first and second patterns may be formed in one-to-one correspondence with each other, and the third and fourth patterns may be formed in one-to-one correspondence with each other.

The encapsulation substrate may include a window substrate for protecting the display device.

BRIEF DESCRIPTION OF THE DRAWINGS

The above and other features and advantages of the present invention will become more apparent by describing in detail certain embodiments thereof with reference to the attached drawings in which.

DETAILED DESCRIPTION OF CERTAIN INVENTIVE EMBODIMENTS

The present invention may allow various kinds of change or modification and various changes in form, and specific embodiments will be illustrated in drawings and described in detail in the specification. However, it should be understood that the specific embodiments do not limit the present invention to a specific disclosing form but include every modified, equivalent, or replaced one within the spirit and technical scope of the present invention. In the following description, well-known functions or constructions are not described in detail since they would obscure the description with unnecessary detail.

Although terms, such as 'first' and 'second', can be used to describe various elements, the elements are not to be limited by the terms. The terms can be used to classify a certain element from another element.

The terminology used in the application is used only to describe specific embodiments and does not have any intention to limit the inventive concepts. An expression in the singular includes an expression in the plural unless they are clearly different from each other in a context. In the application, it should be understood that terms, such as 'include' and 'have', are used to indicate the existence of implemented feature, number, step, operation, element, part, or a combination of them without excluding in advance the possibility of existence or addition of one or more other features, numbers, steps, operations, elements, parts, or combinations of them.

Embodiments of a display device according to the present invention will now be described more fully with reference to the accompanying drawings. Like reference numerals in the drawings generally denote like elements, and thus their repetitive description will be omitted.

As used herein, the term "and/or" includes any and all combinations of one or more of the associated listed items.

Figure 1:
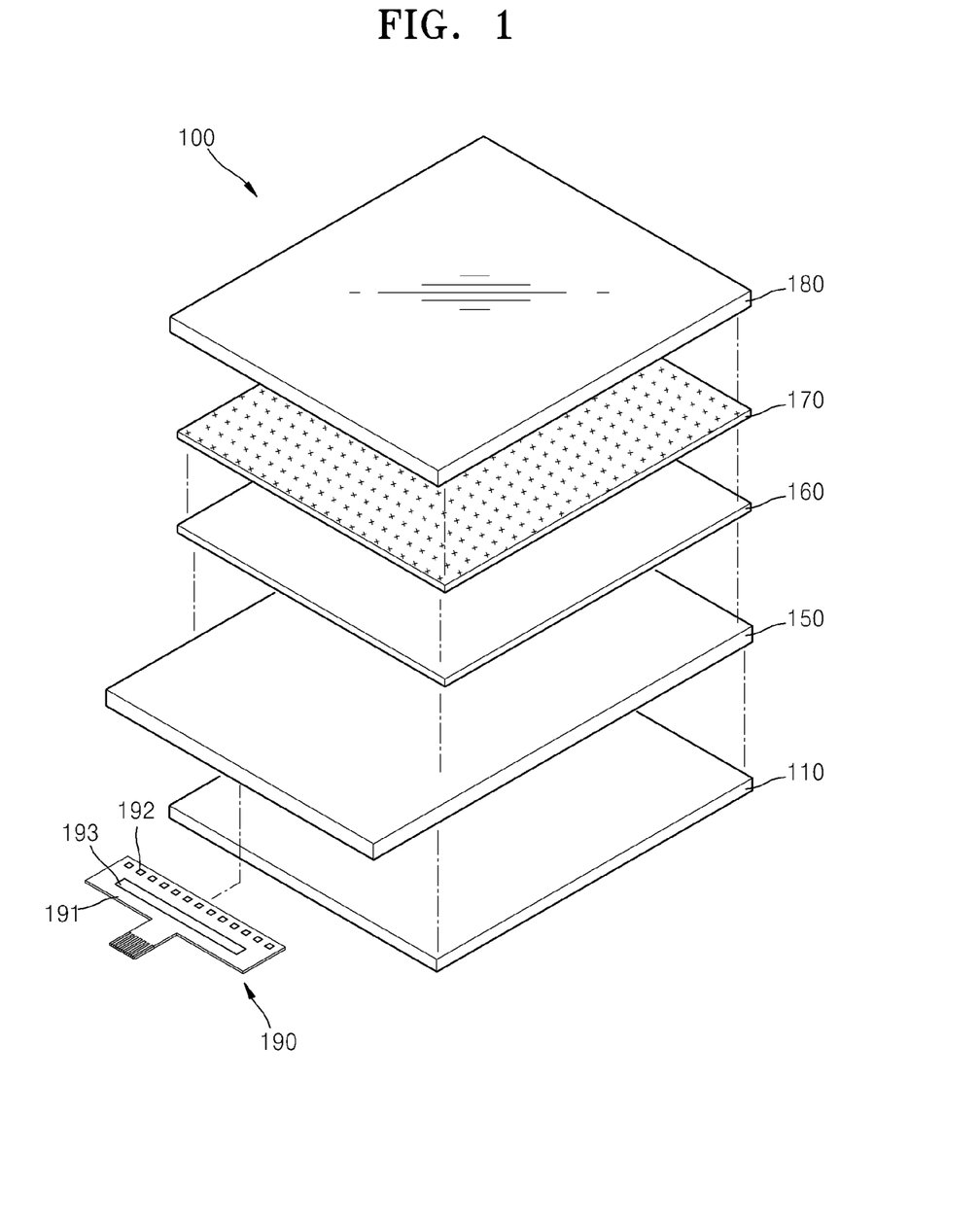
FIG. 1 is an exploded perspective view of a display device according to an embodiment of the present invention.
Figure 2:
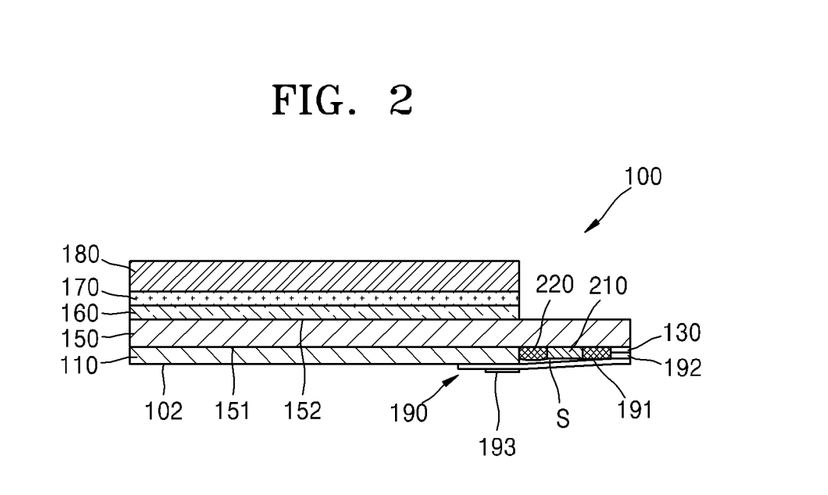
FIG. 2 is a cross-sectional view of the assembled display device of FIG. 1.
Figure 3:
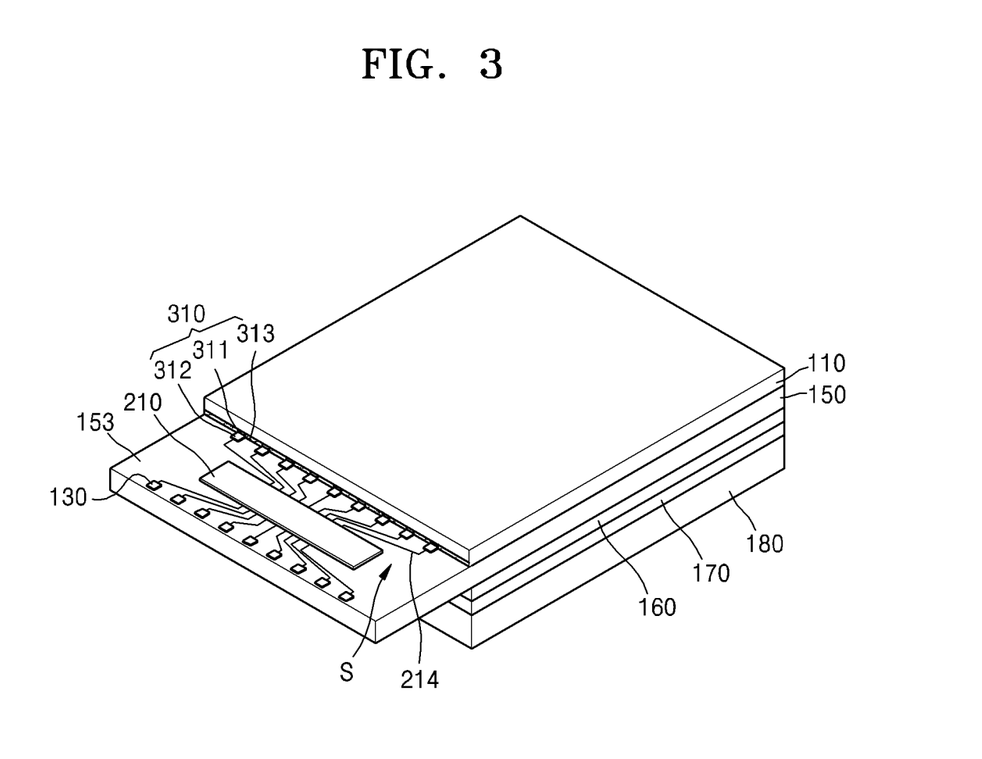
FIG. 3 is a perspective view of an assembly of a display substrate and an encapsulation substrate in FIG. 1 when the assembly is viewed from an opposite direction without a circuit substrate.

FIG. 1 is an exploded perspective view of a display device 100 according to an embodiment of the present invention, FIG. 2 is a cross-sectional view of the assembled display device 100 of FIG. 1, and FIG. 3 is a perspective view of an assembly of a display substrate 110 and an encapsulation substrate 150 in FIG. 1 when the assembly is viewed from an opposite direction.

In one embodiment, although the display device 100 is shown as an organic light-emitting display device, the display device 100 may also be applied to other display devices, such as a liquid crystal display (LCD) panel, an electric field emitting display panel, a plasma display panel (PDP), an electric field light-emitting display panel, and an electrophoretic display panel.

Referring to FIGS. 1 to 3, the display device 100 includes the display substrate 110. The display substrate 110 is a substrate in which a display for displaying an image is formed. The display includes at least one thin film transistor (TFT) and an organic light-emitting device (OLED). However, the display is not limited thereto, and various display devices are applicable to the display.

The encapsulation substrate 150 for sealing the display is formed on the display substrate 110. The encapsulation substrate 150 is a thin film substrate formed of glass or a resin.

Figure 10:
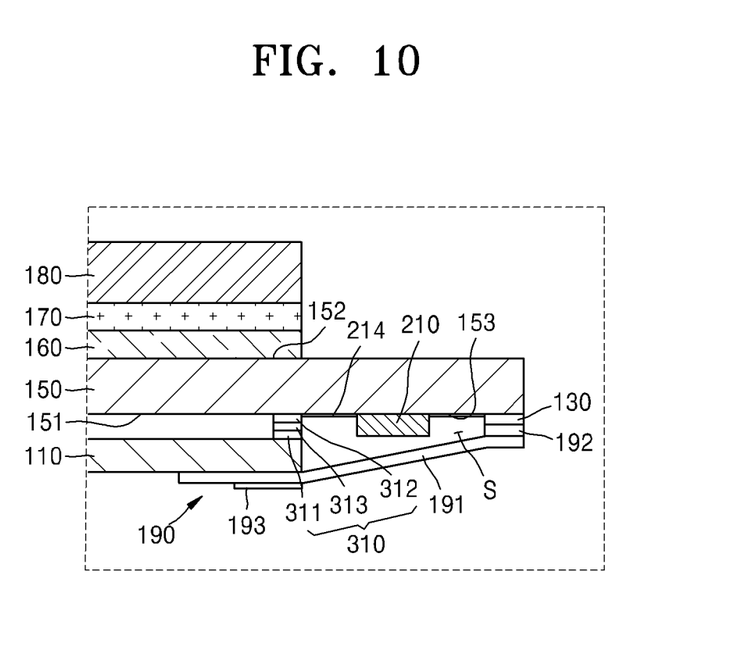
FIG. 10 is a cross-sectional view of the assembly device showing a separation space S.

FIG. 10 shows a cross-sectional view of the assembly device in which a separation space S exists between an exposed area 153 of the encapsulation substrate 150 and the circuit substrate 190. A filling member (shown as 220 in FIG. 2) can be formed between the exposed area 153 of the encapsulation substrate 150 and the circuit substrate 190 to fill up space S.

Figure 5:
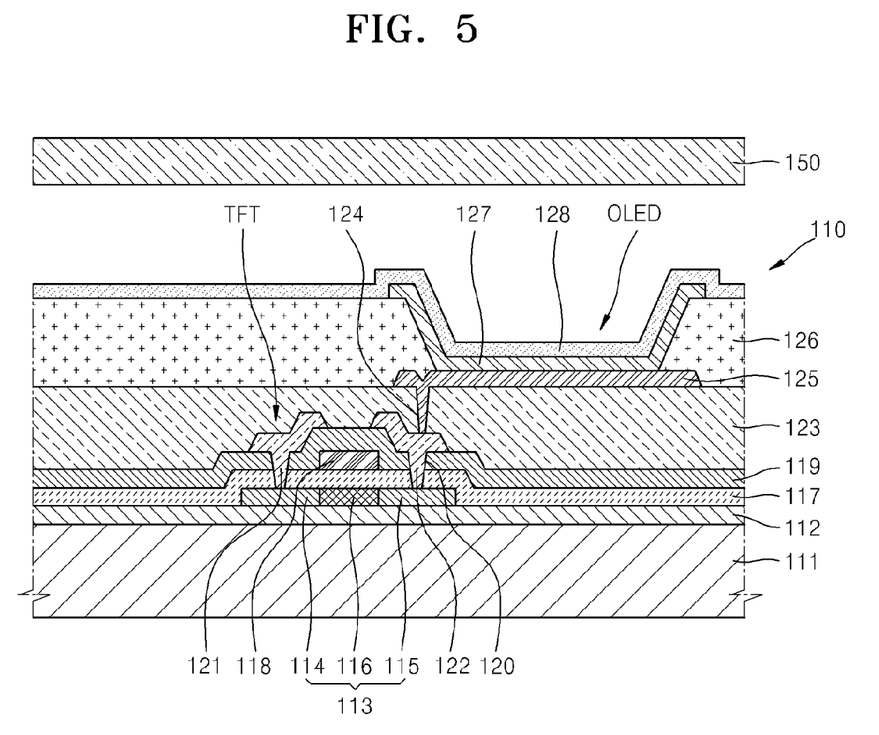
FIG. 5 is a cross-sectional view of one sub-pixel of the display device of FIG. 1.

In more detail, referring to FIG. 5, the display substrate 110 includes a substrate 111. The substrate 111 is a thin film substrate formed of glass or a high-molecular resin. The substrate 111 may be a flexible substrate having flexibility.

A barrier layer 112 is formed on the substrate 111. The barrier layer 112 may be of an inorganic material, such as silicon oxide ($SiO_x$), silicon nitride ($SiN_x$), silicon oxide nitride (SiON), aluminum oxide (AlO), or aluminum oxide nitride (AlON), or an organic material, such as acryl or polyimide, or may be of organic materials and inorganic materials, which are alternately layered. The barrier layer 112 blocks oxygen and humidity, prevents diffusion of humidity generated from the substrate 111 or impurities, and adjusts a heat transfer speed in crystallization so that crystallization of a semiconductor is well performed.

A TFT is formed on the barrier layer 112. Although the TFT has a structure of a top gate type transistor in one embodiment, a TFT having another structure, such as a bottom gate type transistor, may be alternatively used.

A semiconductor active layer 113 is formed on the barrier layer 112. When the semiconductor active layer 113 is formed of polysilicon, amorphous silicon is first formed and crystallized into polysilicon.

Various methods, such as a Rapid Thermal Annealing (RTA) method, a Solid Phase Crystallization (SPC) method, an Excimer Laser Annealing (ELA) method, a Metal-Induced Crystallization (MIC) method, a Metal-Induced Lateral Crystallization (MILC) method, and a Sequential Lateral Solidification (SLS) method, may be applied as a method of crystallizing amorphous silicon. A method which does not require a high-temperature heating process may be used.

For example, when crystallization is performed by a low-temperature polysilicon (LTPS) process, a time the substrate 111 is exposed to a high temperature equal to or greater than 300° C. can be removed by irradiating laser beams for a short time to activate the semiconductor active layer 113 so that the entire process is performed at less than 300° C.

A source area 114 and a drain area 115 are formed by doping the semiconductor active layer 113 with N- or P-type impurity ions. An area between the source area 114 and the drain area 115 is a channel area 116 that is not doped with impurities.

A gate insulation film 117 is evaporated on the semiconductor active layer 113. The gate insulation film 117 has a single layer structure of silicon dioxide ($SiO_2$) or a double-layer structure of $SiO_2$ and silicon nitride ($SiN_x$).

A gate electrode 118 is formed in a predetermined area on the gate insulation film 117. The gate electrode 118 is connected to a gate line (not shown) for applying a TFT on/off signal. The gate electrode 118 may be formed of a single or multiple metals and is preferably formed of a multi-layer film of molybdenum (Mo), molybdenum-tungsten (MoW), chrome (Cr), aluminum (Al), magnesium (Mg), Nickel (Ni), tungsten (W), gold (Au), and so forth or a multi-layer film of mixtures of them.

An inter-layer insulation film 119 is formed on the gate electrode 118, and through contact holes 120, a source electrode 121 is electrically connected to the source area 114, and a drain electrode 122 is electrically connected to the drain area 115.

The inter-layer insulation film 119 may be formed of an insulating material, such as $SiO_2$ or $SiN_x$, or an insulating organic material. The contact holes 120 may be formed by selectively removing a portion of the gate insulation film 117 and a portion of the inter-layer insulation film 119.

A protection film (passivation film and/or planarization film) 123 is formed on the source electrode 121 and the drain electrode 122. The protection film 123 protects and planarizes the TFT therebelow. The protection film 123 may be formed in various forms such that the protection film 123 has a single-layer structure, a double-layer structure, or a multi-layer structure, and may be formed of an organic material, such as benzocyclobutene (BCB) or acryl, or an inorganic material such as $SiN_x$.

A first electrode 125 is electrically connected to any one of the source electrode 121 and the drain electrode 122 through a contact hole 124 to form an OLED on the TFT.

The first electrode 125 functions as an anode electrode from among electrodes included in the OLED and may be formed of various conductive materials. The first electrode 125 may be formed as a transparent electrode or a reflective electrode according to the OLED.

For example, when the first electrode 125 is formed as a transparent electrode, the first electrode 125 may include indium tin oxide (ITO), indium zinc oxide (IZO), zinc oxide (ZnO), or indium oxide ($In_2O_3$), and when the first electrode 125 is formed as a reflective electrode, a reflection film may be formed of silver (Ag), magnesium (Mg), aluminum (Al), platinum (Pt), palladium (Pd), gold (Au), Nickel (Ni), neodymium (Nd), iridium (Ir), chrome (Cr), or a compound of them, and thereafter, ITO, IZO, ZnO, or $In_2O_3$ is formed on the reflection film.

A pixel-defining layer (PDL) 126 is formed on the protection film 123 to cover a portion of the first electrode 125, wherein the PDL is formed of an organic material.

An organic film 127 is formed on a portion of the first electrode 125, which is exposed to the outside by etching a portion of the PDL 126. A second electrode 128 of the OLED is formed on the organic film 127.

The first electrode 125 and the second electrode 128 are insulated from each other by the organic film 127 and apply voltages of different polarities to the organic film 127 so that light is emitted from the organic film 127.

Although in the embodiment of FIG. 5, the organic film 127 is patterned to correspond to only each sub-pixel, i.e., each patterned first electrode 125, this is only shown for convenience to describe a configuration of a sub-pixel, and the organic film 127 may be formed as one body with an organic film 127 of an adjacent sub-pixel. In addition, the organic film 127 may be modified in various forms such that some layers of the organic film 127 are formed for each sub-pixel and the remaining layers are formed in one body with an organic film 127 of an adjacent sub-pixel.

The organic film 127 may be formed of a low-molecular organic material or a high-molecular organic material.

When the organic film 127 is formed of a low-molecular organic material, the organic film 127 may be formed by layering a hole injection layer (HIL), a hole transport layer (HTL), an emissive layer (EML), an electron transport layer (ETL), and an electron injection layer (EIL) in a single or complex structure.

Organic materials available to form the organic film 127 are copper phthalocyanine (CuPc), N,N'-Di(naphthalene-1-yl)-N,N'-diphenyl-benzidine (NPB), tris-8-hydroxyquinoline aluminum (Alq3), and so forth. These low-molecular organic materials may be formed by a method, such as a vacuum evaporation method using masks.

When the organic film 127 is formed of a high-molecular organic material, the organic film 127 may have a structure including an HTL and an EML. In this case, Polyethylenedioxythiophene (PEDOT) is used as the HTL, and a high-molecular organic material, such as a poly-phenylenevinylene (PPV) system or a polyfluorene system, is used as the EML. The high-molecular organic materials may be formed by a screen printing method or an inkjet printing method.

The organic film 127 is not necessarily limited thereto, and various embodiments are alternatively applicable to the organic film 127.

Like the first electrode 125, the second electrode 128 may be formed as a transparent electrode or a reflective electrode.

When the second electrode 128 is formed as a transparent electrode, a metal having a low work function, i.e., lithium (Li), calcium (Ca), lithium fluoride/aluminum (LiF/Al), aluminum (Al), magnesium (Mg), or a compound of them is evaporated on the organic film 127, and thereafter an auxiliary electrode formed of a material for forming a transparent electrode, such as ITO, IZO, ZnO, or $In_2O_3$, may be formed on the evaporated metal.

When the second electrode 128 is formed as a reflective electrode, the second electrode 128 is formed by evaporating Li, Ca, LiF/Al, Al, Mg, or a compound of them on the whole display area.

When the first electrode 125 is formed as a transparent electrode or a reflective electrode, the first electrode 125 may be formed in a shape corresponding to a sub-pixel aperture shape. The second electrode 128 may be formed by evaporating a transparent electrode or a reflective electrode on the whole display area. The second electrode 128 does not have to be evaporated on the whole display area and may be formed in various patterns. In this case, the first electrode 125 and the second electrode 128 may be layered by exchanging their positions.

The encapsulation substrate 150 is formed on the OLED. The encapsulation substrate 150 is a thin film substrate formed of glass or a high-molecular resin. Alternatively, instead of the encapsulation substrate 150, the OLED may be sealed by fabricating the OLED and then forming an organic and/or an inorganic film on the OLED.

Referring back to FIGS. 1 to 3, a touch screen 160 is formed on the encapsulation substrate 150. The touch screen 160 is an on-cell touch screen panel (TSP) in which a touch screen pattern is formed. The touch screen 160 may be a one-body type directly formed on the outer surface of the encapsulation substrate 150 or may be formed on a separately prepared substrate.

The touch screen 160 may be applicable to any touch screen of any one selected from an electrostatic capacitive type, a resistive type, an electro-magnetic type, a saw type, and an infrared type.

A polarization plate 170 is formed on the outer surface of the touch screen 160. The polarization plate 170 prevents external light from being reflected from the display.

A window cover 180 is assembled on the polarization plate 170.

A circuit substrate 190 for transferring electrical signals to the display is assembled with one side of an assembly of the display substrate 110 and the encapsulation substrate 150. The circuit substrate 190 is preferably a flexible printed circuit board (FPCB) having flexibility. The circuit substrate 190 includes a film 191 having flexibility, terminals 192 formed on one side of the film 191, and an integrated circuit (IC) 193 formed on the film 191.

A plurality of pads 130, which are electrically connected to the display and are connected to the circuit substrate 190, are formed on the encapsulation substrate 150.

In more detail, the encapsulation substrate 150 has a first surface 151 facing the display substrate 110 and a second surface 152, which is opposite to the first surface 151 and faces the touch screen 160. Alternatively, when the display device 100 is a flexible display device, when a thin-film encapsulation layer is formed to cover the display substrate 110, the encapsulation substrate 150 may be the window cover 180 mounted on the thin-film encapsulation layer to protect the display device 100.

An area of at least one side of the encapsulation substrate 150 extends outside the display substrate 110. The encapsulation substrate 150 extends along a length direction of the display substrate 110 by a predetermined length. Accordingly, the encapsulation substrate 150 has an area 153 exposed towards the outer side of the display substrate 110.

Although the encapsulation substrate 150 has an appearance that the encapsulation substrate 150 is formed larger than the display substrate 110 along the length direction of the display substrate 110 in the embodiment illustrated, if the encapsulation substrate 150 includes the area 153 exposed from the display substrate 110, the encapsulation substrate 150 may have an appearance that the encapsulation substrate 150 is formed larger than the display substrate 110 along a width direction of the display substrate 110 or along both the length direction and the width direction of the display substrate 110 without limitation.

The plurality of pads 130 are formed on the exposed area 153 of the encapsulation substrate 150. The plurality of pads 130 are formed on a length-directional edge of the encapsulation substrate 150. The plurality of pads 130 are patterned to be separated by a predetermined distance along the width direction of the encapsulation substrate 150. The terminals 192 of the circuit substrate 190 are electrically connected to the plurality of pads 130, respectively.

While the display is formed in the display substrate 110, the plurality of pads 130 are formed on the encapsulation substrate 150. To electrically connect the plurality of pads 130 to the display, a connector 310 is formed between the display substrate 110 and the encapsulation substrate 150.

The connector 310 includes a plurality of first and second patterns 311 and 312 formed on the facing surfaces of the display substrate 110 and the encapsulation substrate 150, respectively, and a conductor 313 for electrically connecting the plurality of first and second patterns 311 and 312 to each other.

Figure 4:
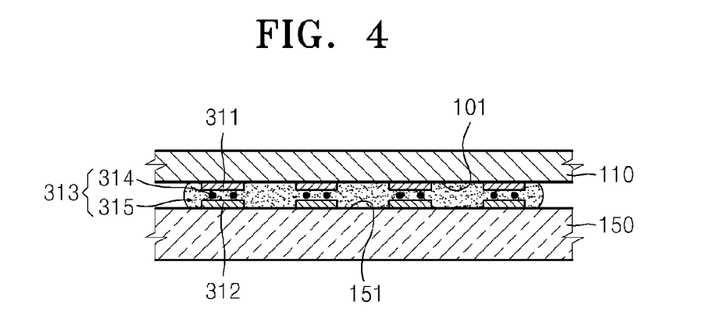
FIG. 4 is a magnified cross-sectional view of a part in which a connector in FIG. 3 is formed.

In more detail, referring to FIG. 4, the a plurality of first patterns 311 are formed on one surface 101 of the display substrate 110, which faces the first surface 151 of the encapsulation substrate 150. The plurality of first patterns 311 are electrically connected to corresponding devices in the display. The plurality of first patterns 311 are formed along one edge of the display substrate 110.

A plurality of second patterns 312 are formed on the first surface 151 of the encapsulation substrate 150 at locations corresponding to the plurality of first patterns 311 in a vertical direction of the display device 100. The plurality of first patterns 311 and the plurality of second patterns 312 have substantially the same pattern.

The conductor 313 includes a conductive film interposed between the plurality of first patterns 311 and the plurality of second patterns 312. The conductive film of the conductor 313 is preferably a film through which a current flows along a thickness direction thereof and which blocks the current along a length direction thereof, e.g., an anisotropic conductive film (ACF). The conductor 313 includes conductive particles 314, such as conductive balls forming an electrical path, and an insulating resin 315 for increasing the connection reliability by fixing the conductive particles 314 and for guaranteeing insulation between adjacent patterns.

To electrically connect the encapsulation substrate 150 to the display substrate 110, the conductive particles 314 electrically connect the plurality of first patterns 311 and the plurality of second patterns 312 to each other by aligning the plurality of first patterns 311 and the plurality of second patterns 312 at corresponding locations, interposing the conductor 313 between the plurality of first patterns 311 and the plurality of second patterns 312, and adding heat and pressure from the upper side of the display device 100 using a pressing device such as, for example, a hot bar.

The insulating resin 315 is distributed to the space remaining by combining the plurality of first patterns 311 and the plurality of second patterns 312 and blocks an electrical connection between every adjacent first patterns 311 and every adjacent second patterns 312.

Referring back to FIGS. 1 to 3, the connector 310 is electrically connected to the plurality of pads 130, which are formed on the edge of the encapsulation substrate 150, by a plurality of wiring lines 214.

The plurality of wiring lines 214 are patterned on the exposed area 153 of the encapsulation substrate 150. One ends of the plurality of wiring lines 214 are connected to the plurality of second patterns 312, and the other ends thereof are connected to the plurality of pads 130.

A display driver IC (DDI) 210 for driving the display is further formed on the exposed area 153 of the encapsulation substrate 150. The DDI 210 is mounted on a path at which the connector 310 and the plurality of pads 130 are electrically connected to each other and is connected to the plurality of wiring lines 214.

The touch screen 160, the polarization plate 170, and the window cover 180 are formed on the second surface 152 of the encapsulation substrate 150.

In the display device 100, the plurality of first patterns 311 formed on the surface 101 of the display substrate 110 and the plurality of second patterns 312 formed on the first surface 151 of the encapsulation substrate 150 are electrically connected to each other by the conductor 313. In addition, the terminals 192 of the circuit substrate 190 are electrically connected to the plurality of pads 130 formed on the exposed area 153 of the encapsulation substrate 150 by heating and pressing, respectively.

In the display device 100, the exposed area 153 is on the edge of the first surface 151 of the encapsulation substrate 150, which faces the display substrate 110, and on the exposed area 153, the connector 310, the DDI 210, the plurality of pads 130, and the circuit substrate 190 can be electrically connected.

Furthermore, the circuit substrate 190 does not have to be bent towards the second surface 152 of the encapsulation substrate 150, and can be located on an outer surface 102 of the display substrate 110 in a direct line state after the terminals 192 are connected to the plurality of pads 130, respectively.

Accordingly, cracks in a bending part, which may occur due to a bending process of the circuit substrate 190, a connection malfunction between the plurality of pads 130 and the terminals 192 due to a tension of the circuit substrate 190, and cracks of the DDI 210 due to exposure to the outside can be prevented.

When the circuit substrate 190 is arranged to extend from the first surface 152 of the encapsulation substrate 150 to the outer surface 102 of the display substrate 110, a space may exist between the exposed area 153 of the encapsulation substrate 150 and the circuit substrate 190.

A filling member 220 may be further formed between the exposed area 153 of the encapsulation substrate 150 and the circuit substrate 190 to fill up the space. The filling member 220 includes a cushion tape formed on the first surface 151 of the encapsulation substrate 150, a high-molecular resin, such as silicon or epoxy, applied to the space, a desiccant, and so forth.

Accordingly, a damage due to movement of the circuit substrate 190 or carelessness can be prevented.

Figure 6:
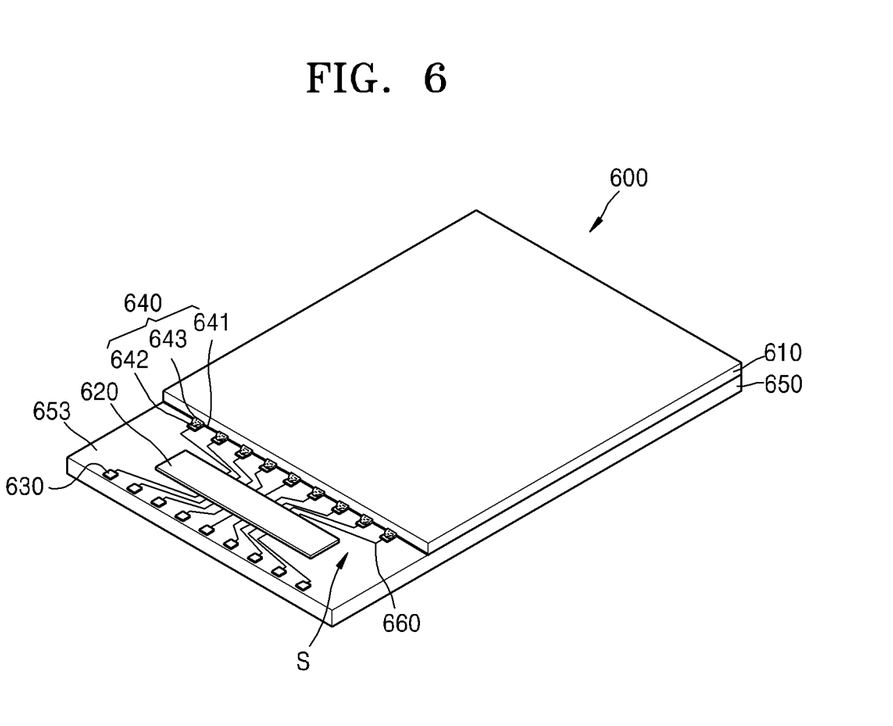
FIG. 6 is a perspective view of an assembly of a display substrate and an encapsulation substrate in a display device according to another embodiment of the present invention.
Figure 7:
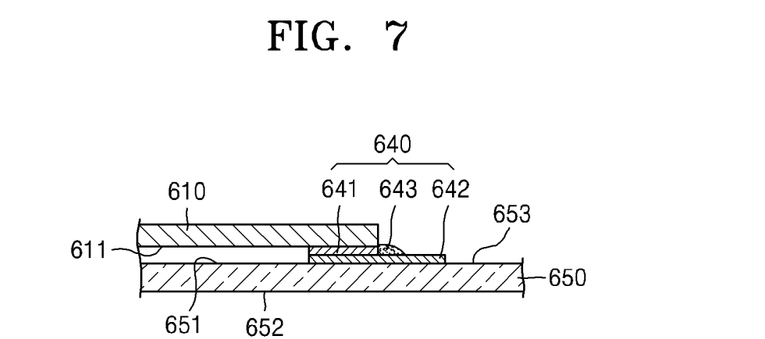
FIG. 7 is a magnified cross-sectional view of a part in which a connector in FIG. 6 is formed.

FIG. 6 is a perspective view of an assembly of a display substrate 610 and an encapsulation substrate 650 in a display device 600 according to another embodiment of the present invention, and FIG. 7 is a magnified cross-sectional view of a part in which a connector 640 in FIG. 6 is formed.

Hereinafter, the connector 640 will be mainly described.

Referring to FIGS. 6 and 7, the display device 600 includes the display substrate 610 in which a display is formed, and the encapsulation substrate 650.

The encapsulation substrate 650 has a first surface 651 facing the display substrate 610 and a second surface 652 opposite to the first surface 651. The encapsulation substrate 650 has an area 653 which extends along a length direction of the display substrate 610 by a predetermined length and is exposed towards the outer side of the display substrate 610. A plurality of pads 630 are formed on an edge of the exposed area 653 of the encapsulation substrate 650.

The connector 640 is formed between the display substrate 610 and the encapsulation substrate 650 to connect the plurality of pads 630 to the display formed in the display substrate 610.

The connector 640 includes a plurality of first and second patterns 641 and 642 formed on the facing surfaces of the display substrate 610 and the encapsulation substrate 650, respectively, and a conductor 643 for electrically connecting the plurality of first and second patterns 641 and 642 to each other.

The plurality of first and second patterns 641 and 642 include a plurality of first patterns 641 and a plurality of second patterns 642.

The plurality of first patterns 641 are formed on one surface 611 of the display substrate 610, which faces the first surface 651 of the encapsulation substrate 650. The plurality of first patterns 641 are electrically connected to corresponding devices in the display.

The plurality of second patterns 642 are formed on the first surface 651 of the encapsulation substrate 650 at locations corresponding to the plurality of first patterns 641 in a vertical direction of the display device 600. The plurality of second patterns 642 have substantially the same pattern as the plurality of first patterns 641.

The conductor 643 is a conductive paste interposed between the plurality of first patterns 641 and the plurality of second patterns 642. The conductive paste 643 is a material having excellent conductivity, such as a silver (Ag) paste.

To electrically connect the encapsulation substrate 650 to the display substrate 610, the plurality of first patterns 641 and the plurality of second patterns 642 are connected to each other by aligning the plurality of first patterns 641 and the plurality of second patterns 642 at corresponding locations and coating the conductive paste 643 from a side wall of the display substrate 610 to the exposed area 653 of the encapsulation substrate 650.

A plurality of wiring lines 660 for electrically connecting the plurality of pads 630 and the connector 640 are formed on the exposed area 653 of the encapsulation substrate 650, and a DDI 620 is mounted on a path in which the plurality of pads 630 and the connector 640 are electrically connected.

In the display device 600, the exposed area 653 is on the first surface 651 of the encapsulation substrate 650, which faces the one surface 611 of the display substrate 610, and on the exposed area 653, the connector 640, the DDI 620, and the plurality of pads 630 are electrically connected.

Figure 8:
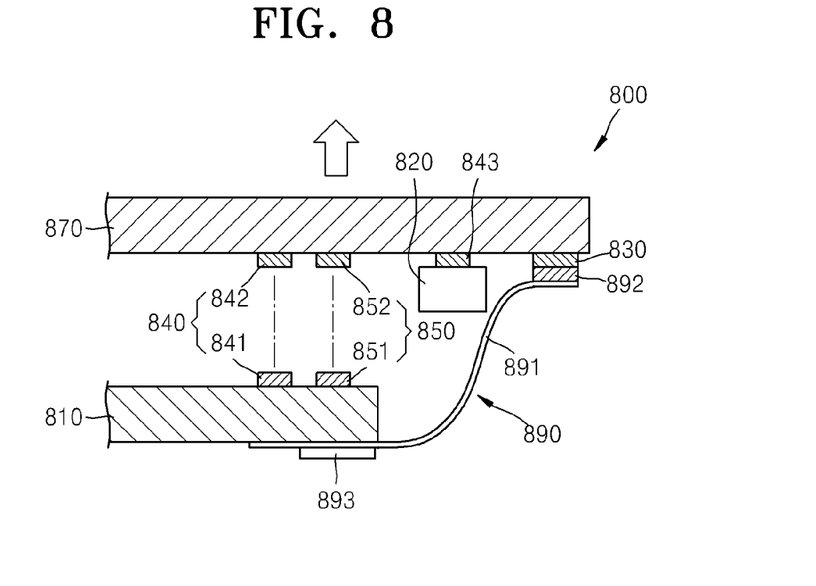
FIG. 8 is a cross-sectional view of a display substrate and an encapsulation substrate separated from a display device according to another embodiment of the present invention.
Figure 9A:
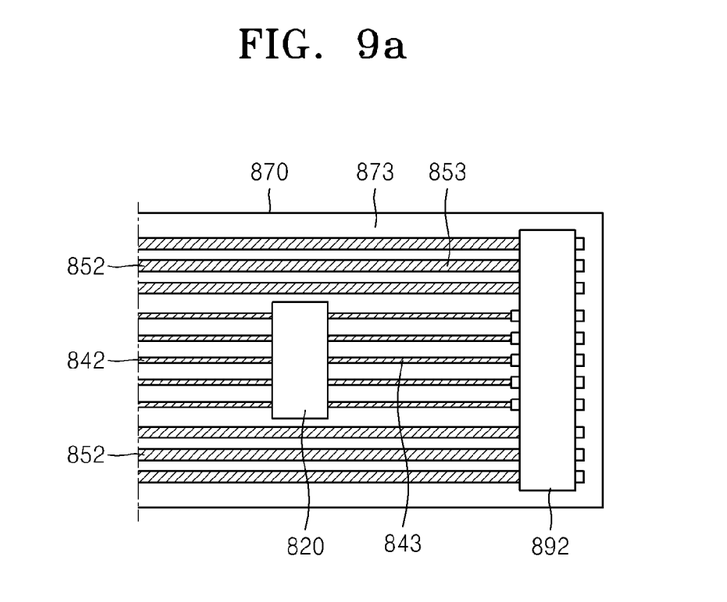
FIG. 9A is a top view of the encapsulation substrate of FIG. 8.
Figure 9B:
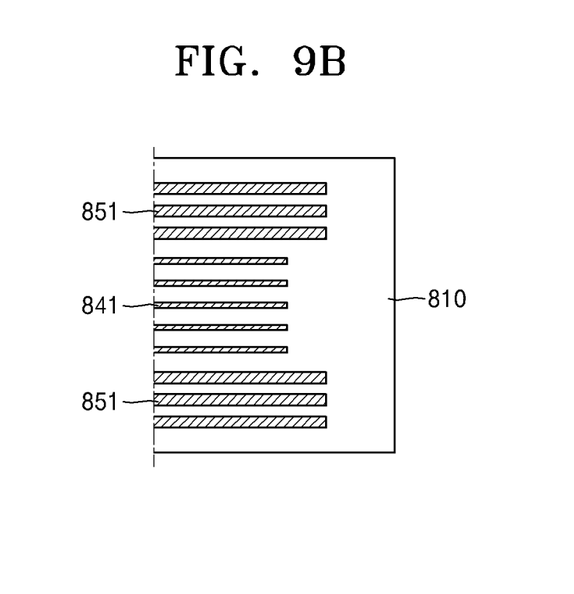
FIG. 9B is a top view of the display substrate of FIG. 8.

FIG. 8 is a cross-sectional view of a display substrate 810 and an encapsulation substrate 870 separated from a display device 800 according to another embodiment of the present invention, FIG. 9A is a top view of the encapsulation substrate 870 of FIG. 8, and FIG. 9B is a top view of the display substrate 810 of FIG. 8.

Locations of first, second, third, and fourth patterns 841, 842, 851, and 852 disclosed in FIG. 8 are shown to be arranged on upper and lower surfaces of the display substrate 810 and the encapsulation substrate 870 by cutting another portion of the display substrate 810 and the encapsulation substrate 870, and relative locations of the first, second, third, and fourth patterns 841, 842, 851, and 852 are clearly shown in FIGS. 9A and 9B.

Referring to FIG. 8, the display device 800 includes the display substrate 810 on which a display is formed and the encapsulation substrate 870.

The encapsulation substrate 870 is formed larger than the display substrate 810, and an area 873 exposed outside the display substrate 810 is formed on the encapsulation substrate 870. A plurality of pads 830 are formed on an edge of the exposed area 873 of the encapsulation substrate 870 on a surface of the encapsulation substrate 870, which faces the display substrate 810.

A circuit board 890 is mounted at one side of an assembly of the display substrate 810 and the encapsulation substrate 870. The circuit board 890 includes a flexible film 891, a terminal 892 formed on one end of the film 891, and an IC 893 formed on the film 891.

To connect the plurality of pads 830 to the display formed on the display substrate 810, a plurality of connectors 840 and 850 are formed on the display substrate 810 and the encapsulation substrate 870.

The plurality of connectors 840 and 850 are formed on surfaces of the display substrate 810 and the encapsulation substrate 870, which face each other, and include a display driver IC connector 840 and a circuit board connector 850.

The display driver IC connector 840 includes the first pattern 841 formed on the display substrate 810 and the second pattern 842 formed on the encapsulation substrate 870.

The first pattern 841 is formed on one surface of the display substrate 810, which faces the encapsulation substrate 870. The first pattern 841 is electrically connected to each element of the display.

The second pattern 842 is formed on one surface of the encapsulation substrate 870, which corresponds to the first pattern 841, in a vertical direction of the display device 800. The second pattern 842 has substantially the same pattern as the first pattern 841.

A first wiring line 843 is formed on the exposed area 873 of the encapsulation substrate 870. The first wiring line 843 is electrically connected to the second pattern 842 and is substantially formed integrally with the second pattern 842. A display driver IC 820 is mounted on the first wiring line 843. One end of the first wiring line 843 is connected to the plurality of pads 830.

The circuit board connector 850 includes the third pattern 851 formed on the display substrate 810 and the fourth pattern 852 formed on the encapsulation substrate 870.

The third pattern 851 is formed on one surface of the display substrate 810, which faces the encapsulation substrate 870. The third pattern 851 is electrically connected to each element of the display.

The fourth pattern 852 is formed on one surface of the encapsulation substrate 870, which corresponds to the third pattern 851, in the vertical direction of the display device 800. The fourth pattern 852 has substantially the same pattern as the third pattern 851.

A second wiring line 853 is formed on the exposed area 873 of the encapsulation substrate 870. The second wiring line 853 is electrically connected to the fourth pattern 852 and is substantially formed integrally with the fourth pattern 852. One end of the second wiring line 853 is connected to the plurality of pads 830.

The first pattern 841 and the second pattern 842 are formed in one-to-one correspondence with each other. The first pattern 841 and the second pattern 842 are electrically connected to each other, and the display driver IC 820 is adhesively pressure-bonded on the first wiring line 843 extending from the second pattern 842, thereby enabling to deliver a signal for driving pixel devices of the display substrate 810.

In addition, the third pattern 851 and the fourth pattern 852 are also formed in one-to-one correspondence with each other. The third pattern 851 and the fourth pattern 852 are also electrically connected to each other, and the terminal 892 of the circuit board 890 is adhesively pressure-bonded on the plurality of pads 830 formed on the one end of the second wiring line 853, thereby enabling to supply external power from the circuit board 890.

As described above, in the plurality of connectors 840 and 850, the display driver IC connector 840 and the circuit board connector 850 are independently formed at different areas.

Accordingly, the bonding of the display driver IC 820 is achieved by adhesively pressing the display driver IC 820 onto the first wiring line 843 extending from the second pattern 842 formed on one side of the encapsulation substrate 870 towards the exposed area 873 as one body, and the bonding of the circuit substrate 890 is achieved by adhesively pressing the circuit substrate 890 onto the second wiring line 853 extending from the fourth pattern 852 formed on the one side of the encapsulation substrate 870 towards the exposed area 873 as one body.

In addition, the third pattern 851 formed on the display substrate 810 is located outside the first pattern 841, and for stability of connection, the third pattern 851 is formed longer than the first pattern 841.

In addition, in the first pattern 841, the second pattern 842, the third pattern 851, the fourth pattern 852, the first wiring line 843, and the second wiring line 853, a portion to be adhesively pressed may be exposed to prevent a short circuit, and the remaining portion may be covered by an inorganic film or an organic film.

To electrically connect the encapsulation substrate 870 to the display substrate 810, the first pattern 841 and the second pattern 842 are aligned at locations corresponding to each other in the vertical direction, the third pattern 851 and the fourth pattern 852 are aligned at locations corresponding to each other in the vertical direction, and a conductor is interposed between the first pattern 841 and the second pattern 842 and between the third pattern 851 and the fourth pattern 852 to electrically connect to each other. As the conductor, a conductive film, such as the ACF of FIG. 4, a conductive paste, such as the silver (Ag) paste of FIG. 6, a non-conductive film (NCF), or the like may be used, and a description thereof is omitted.

The display device 100, 600, or 800 having one of the structures described above is not limited to any one display device if the display device is a device in which upper and lower substrates are combined, such as an active matrix display based on an a-Si:H TFT, an oxide semiconductor, a crystalline structure TFT, an organic TFT, or the like and a passive matrix display, or a device including a display substrate for displaying an image and an encapsulation substrate on which a pad for supplying a signal is formed, wherein the display substrate and the encapsulation substrate are bonded, and a circuit substrate is bent towards a rear surface of the display substrate and used.

According to embodiments of the present invention, since a display device does not require bending of a circuit substrate connected to a plurality of pads, cracks of the circuit substrate can be prevented.

When the circuit substrate is connected to the plurality of pads a connection malfunction due to a tension of the circuit substrate can be prevented.

Since a DDI is not exposed to the outside, damage to the DDI can be prevented.

Since a bending process is not required for a substrate having flexibility, a tact time of an assembly process can be reduced.

While the present invention has been particularly shown and described with reference to certain embodiments thereof, it will be understood by those of ordinary skill in the art that various changes in form and details may be made therein without departing from the spirit and scope of the present invention as defined by the following claims.

What is claimed is:

1. A display device comprising:
   a display substrate in which a display for displaying an image is formed;
   an encapsulation substrate, which is assembled on the display substrate and has a first surface facing the display substrate and a second surface opposite to the first surface; and
   a circuit substrate for transferring an electrical signal to the display, wherein the circuit substrate is arranged to extend from the first surface of the encapsulation substrate to a rear surface of the display substrate, and a window cover disposed on the encapsulation substrate, wherein a plurality of pads, which are electrically connected to the display and connected to the circuit substrate, are formed on the first surface of the encapsulation substrate, and at least one connector is formed on surfaces of the display and the encapsulation substrate which face each other, the connector configured to provide a connection path between the display and the circuit substrate by being adhesively pressed in a vertical direction, wherein an area of at least one side of the encapsulation substrate extends outside the display substrate, and the plurality of pads are formed on the exposed area of the encapsulation substrate and connected to at least one wiring line extending from the at least one connector toward the first surface of the encapsulation substrate, and wherein the at least one connector comprises: a plurality of patterns formed on facing surfaces of the display substrate and the encapsulation substrate; and a conductor for electrically connecting respective pairs of the plurality of patterns formed on each of the display substrate and the encapsulation substrate to each other.

2. The display device of claim 1, wherein the encapsulation substrate is formed larger than the display substrate by at least the exposed area.

3. The display device of claim 1, wherein the plurality of patterns comprise:

a plurality of first patterns, which are formed on one edge of the display substrate and extend from the display; and a plurality of second patterns, which are formed on the encapsulation substrate and are connected to the plurality of pads via wiring lines.

4. The display device of claim 3, wherein the plurality of first patterns and the plurality of second patterns have the same pattern.

5. The display device of claim 3, wherein the conductor comprises a conductive film interposed between the plurality of first patterns and the plurality of second patterns.

6. The display device of claim 5, wherein the conductive film comprises:

conductive particles for electrically connecting the plurality of first patterns and the plurality of second patterns; and an insulating resin surrounding the conductive particles.

7. The display device of claim 3, wherein the conductor is a conductive paste, electrically connects the plurality of first patterns and the plurality of second patterns, and is coated over a side wall of the display substrate at which the plurality of first patterns and the plurality of second patterns contact each other and the exposed area of the encapsulation substrate.

8. The display device of claim 1, wherein the circuit substrate has flexibility to have a plurality of terminals electrically connected to the plurality of pads.

9. The display device of claim 8, wherein a filling member for filling up a separation space is formed on the first surface of the encapsulation substrate facing the circuit substrate.

10. The display device of claim 1, wherein a display driver integrated circuit (IC) is mounted on the at least one wiring line in the exposed area of the encapsulation substrate, and the at least one connector comprises a connector for connecting the display driver IC and a connector for connecting the circuit substrate.

11. The display device of claim 10, wherein the connector for connecting the display driver IC comprises a first pattern formed on the display substrate and extending from the display and a second pattern formed on the encapsulation substrate and formed at a location corresponding to the first pattern in a vertical direction, the connector for connecting the circuit substrate comprises a third pattern formed on the display substrate and extending from the display and a fourth pattern formed on the encapsulation substrate and formed at a location corresponding to the third pattern in the vertical direction, and a conductor electrically connects between the first and second patterns and between the third and fourth patterns.

12. The display device of claim 11, wherein the at least one wiring line comprises a first wiring line and a second wiring line connected to the plurality of pads, the first wiring line extending from the second pattern is formed on the exposed area of the encapsulation substrate, the display driver IC is adhesively pressure-bonded on the first wiring line, the second wiring line extending from the fourth pattern is formed on the exposed area of the encapsulation substrate, and the circuit substrate is adhesively pressure-bonded on the second wiring line.

13. The display device of claim 10, wherein the first and second patterns are formed in one-to-one correspondence with each other, and the third and fourth patterns are formed in one-to-one correspondence with each other.

14. The display device of claim 1, wherein the encapsulation substrate comprises a window substrate for protecting the display device.

* * * * *